United States Patent
Hsiao et al.

(10) Patent No.: US 8,673,712 B2
(45) Date of Patent: Mar. 18, 2014

(54) POWER TRANSISTOR WITH HIGH VOLTAGE COUNTER IMPLANT

(75) Inventors: Shih-Kuang Hsiao, Hsin-Chu (TW); Chen-Liang Chu, Hsin-Chu (TW); Yi-Sheng Chen, Hsin-Chu (TW); Fei-Yuh Chen, Hsin-Chu (TW); Kong-Beng Thei, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/554,880

(22) Filed: Jul. 20, 2012

(65) Prior Publication Data

US 2014/0021539 A1    Jan. 23, 2014

(51) Int. Cl.
| | |
|---|---|
| *H01L 21/8238* | (2006.01) |
| *H01L 21/336* | (2006.01) |
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |

(52) U.S. Cl.
USPC .... 438/199; 438/305; 257/335; 257/E29.264; 257/E21.417; 257/E29.256

(58) Field of Classification Search
USPC .................. 438/199, 305; 257/335, E29.256, 257/E29.264, E21.417
See application file for complete search history.

(56) References Cited

U.S. PATENT DOCUMENTS

| | | | |
|---|---|---|---|
| 5,485,027 A * | 1/1996 | Williams et al. | 257/343 |
| 5,492,847 A | 2/1996 | Kao et al. | |
| 5,514,608 A * | 5/1996 | Williams et al. | 438/286 |
| 2003/0080381 A1* | 5/2003 | Parthasarathy et al. | 257/338 |
| 2010/0219471 A1* | 9/2010 | Cai | 257/335 |

FOREIGN PATENT DOCUMENTS

| | | |
|---|---|---|
| KR | 100373580 B1 | 5/2003 |
| KR | 20050071528 A | 7/2005 |
| WO | 9604679 | 2/1996 |
| WO | 2004030036 A2 | 4/2004 |

OTHER PUBLICATIONS

Hussin, M.R.M., et al., "Blanket and Pocket Anti Punchthrough Device Design Approaches in 0.35-μm CMOS Technology Development," ICSE 2000 Proceedings, Nov. 2000, pp. 39-43.

* cited by examiner

*Primary Examiner* — David S Blum
(74) *Attorney, Agent, or Firm* — Slater & Matsil, L.L.P.

(57) ABSTRACT

Presented herein is a field effect transistor device, optionally a lateral power transistor, and a method for forming the same, comprising providing a substrate, creating a doped buried layer, and creating a primary well in the substrate on the buried layer. A drift drain may be created in the primary well and a counter implant region implanted in the primary well and between the drift drain and the buried layer. The primary well may comprise a first and second implant region with the second implant region at a depth less than the first. The counter implant may be at a depth between the first and second implant regions. The primary well and counter implant region may comprise dopants of the same conductivity type, or both p+-type dopants. A gate may be formed over a portion of a drift drain.

20 Claims, 4 Drawing Sheets

POWER TRANSISTOR WITH HIGH VOLTAGE COUNTER IMPLANT

BACKGROUND

The embodiments described herein relate generally to semiconductor devices, and more particularly to metal-oxide-semiconductor (MOS) devices, and even more particularly to the structure and manufacturing methods of high-voltage MOS devices. High-voltage metal-oxide-semiconductor (HVMOS) devices are widely used in many electrical devices, such as input/output (I/O) circuits, CPU power supplies, power management systems, AC/DC converters, etc. There are a variety of forms of HVMOS devices. A symmetric HVMOS device may have a symmetric structure on the source side and drain side. High voltage can be applied on both drain and source sides. An asymmetric HVMOS device may have asymmetric structures on the source side and drain side.

HVMOS structures have current and breakdown voltage ratings that are functions of the channel dimensions. Ideal HVMOS devices display high breakdown voltages with low resistance between the source and drain when in the "on" state. Power MOS devices, including HVMOS structures, are frequently created and operated in groups, with multiple Power MOS devices operating in parallel to divide current between the multiple devices. With multiple devices operating in close proximity, and at high voltages, devices may be isolated using several techniques, including shallow trench isolation (STI) and additional peripheral high voltage n-wells (HVNW) and p-wells (HVPW).

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the invention, and do not limit the scope of the invention.

The embodiments of the present disclosure are described with reference to FIGS. 1 through 7, and variations of the embodiments are also discussed. Throughout the various views and illustrative embodiments of the present disclosure, like reference numbers are used to designate like elements. Additionally, the drawings are intended to be illustrative, and are not to scale and not intended to be limiting.

Figure 1A:
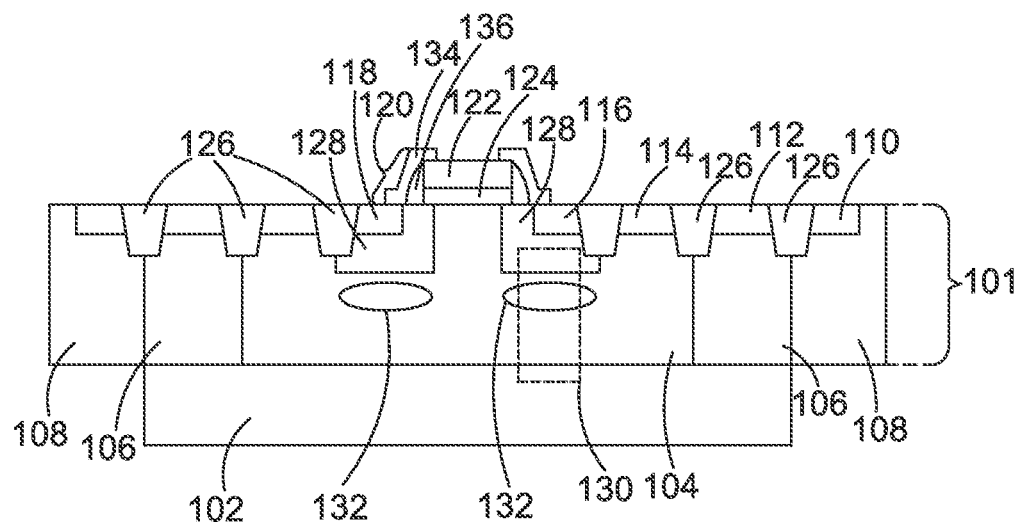
FIG. 1A illustrates a cross sectional view of an HVMOS device according to an embodiment.

Referring to FIG. 1A, a lateral HVMOS or power MOS device according an embodiment is shown. A substrate 101 is initially provided and may comprise a semiconductor material such as silicon, although other materials may be used according to device design requirements. A buried layer may be created, and in the presented embodiment, may be referred to as an n-bulk substrate or an n+ buried layer (NBL) 102. In one embodiment, the NBL 102 is doped with an n-type dopant, but in a p-type transistor embodiment, the buried layer can also be doped with p-type dopants to form a p-type buried layer. The NBL 102 may be formed in the substrate 101 through ion implantation, thermal diffusion or like mechanisms, or the NBL 102 may be a result of a doped wafer used as a substrate 101. Alternatively, the NBL 102 may be formed on the substrate 102 via epitaxial growth or the like.

A primary high voltage p-well (HVPW) 104 may be created over, and in contact with, the NBL 102, with an isolation high voltage n-well (HVNW) 106 and substrate HVPW 108 disposed outside primary HVPW 104 to isolate the device from adjacent devices. An n+ source 118 and n+ drain 116 may each be disposed in n-type drift drain (NDD) 128 regions along opposing sides of a gate structure 120. A gate structure 120 may comprise a gate electrode 122, gate dielectric 124, a gate spacer 136 and insulating layer 134. One or more counter implant regions 132 may be disposed in the primary HPVW 104 between the NDDs 128 and the NBL 102. Shallow trench isolation (STI) structures 126 may be used to isolate the source 118 and drain 116 from p+ base structures 114. STI structures 126 may also be used to isolate n+ isolation contacts 112 disposed on the isolation HVNW 106 and p+ substrate contacts 110 disposed on the substrate HVPW 108.

One consideration in high voltage operation of a device described herein is emergence of a parasitical vertical BJT 130. The vertical BJT 130 may emerge under high drain-to-NBL voltages, with the NDD 128, primary HVPW 104 and NBL 102 acting as an N-P-N bipolar junction transistor 130. High voltages may cause the NPN BJT 130 to turn on, with the NBL 102 acting as an emitter, the primary HVPW 104 acting as the base and the NDD 128 acting as the collector. Turning on this parasitic BJT 130 permits high base current from the primary HVPW 104 through the NDD 128, and possibly damage to the device. Embodiments such as those disclosed herein alter the doping profile of the primary HVPW 104 region acting as the parasitic BJT 130 base to raise the voltage required to turn on the BJT 130. Other embodiments may be applied, for example, to a lateral power transistor, which is described herein as a non-limiting example of the presented disclosure.

Those skilled in the art will recognize that the embodiments disclosed herein describe an NMOS device, but that embodiments such as those disclosed herein may also be used to form a PMOS device, an NPN or PNP BJT, or the like. For example, the NBL 102 may be a p-type buried layer, the primary well 104 may be a HVNW, the source 118 and drain 116 may be p+ type structures, and the like. Additionally, while the dopants discussed in specific terms and with reference to specific doping materials, concentrations and doping depths, those skilled in the art will recognize that alternative doping characteristics may be advantageously employed.

Figure 1B:
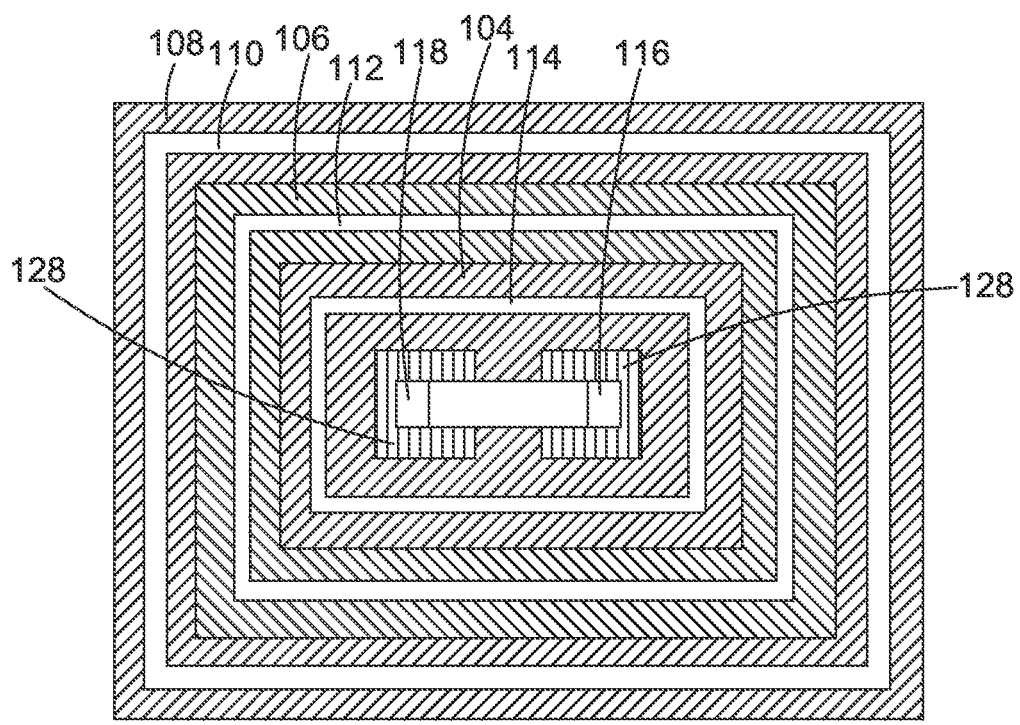
FIG. 1B illustrates a top view of a HVMOS device according to an embodiment.

FIG. 1B shows a top view of the device with the STI structures 126 omitted for clarity. The primary HVPW 104 is disposed in the center of the isolation HVNW 106 and substrate well 108 and their associated contacts 110 and 112. Similarly, the p+ base structure 114 encircles the source 118, drain 116, and NDDs 128 which are disposed in the primary HVPW 104.

Figure 2:
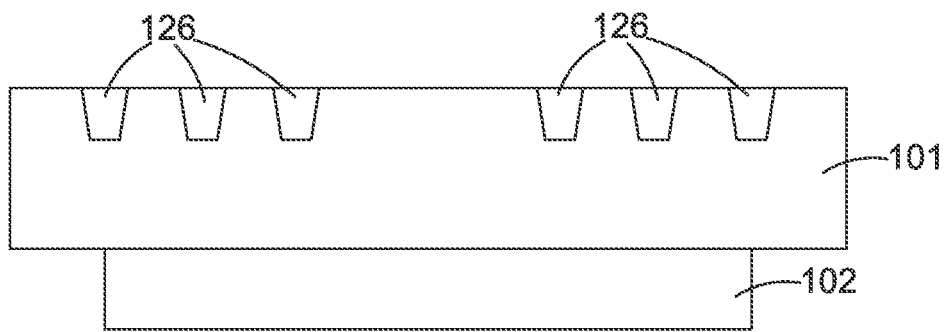
FIGS. 2-7 are cross-sectional views of intermediate stages in the manufacture of an HVMOS device according to an embodiment.

FIGS. 2-7 illustrate cross-sectional views of intermediate stages of a method of manufacturing an HVMOS device according to embodiments of the disclosure. Referring now to FIG. 2, the NBL 102 may be formed. The NBL 102 may be doped with antimony (Sb) via ion implantation to a concentration of about 5.0E13 to about 1.5E14 at an energy between about 70 keV and about 90 keV, and to a depth of greater than about 2 micrometers. Skilled artisans will recognize that other n-type dopants may be used depending on the design requirements of the device. For example, antimony exhibits less autodoping during epitaxy and the following heat cycles, but has a lower solubility limit compared to arsenic, which may necessitate higher anneal temperatures to activate the antimony.

Additionally, one or more STI structures 126 may be formed in the substrate 101 to define the boundaries of doped wells such as the primary HVPW 104, the isolation HVNW 106 and the substrate HVPW 108 (as shown below with reference to FIG. 3). The STI structures 126 may be filled with an insulator or dielectric material, and may be used to isolate well contacts that may be implanted near the surface of the device in later steps.

Figure 3:
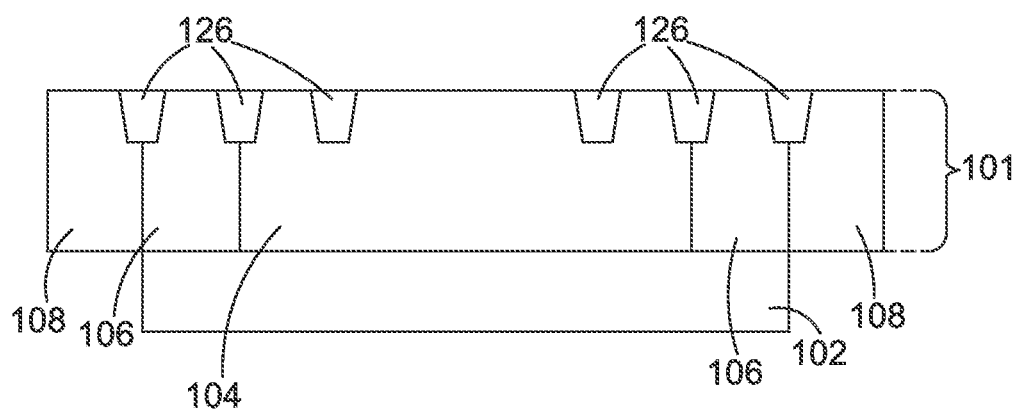

FIG. 3 illustrates formation of well structures. The wells 104, 106 and 108 may be formed by implanting ions into the substrate on top of the NBL 102, or may alternately be implanted into an epitaxial layer grown on the NBL 102. The primary HVPW 104 and substrate HVPW 108 may be advantageously implanted at the same time by masking and performing one or more ion implantations to form the primary HVPW 104 and substrate HVPW 108. The isolation HVNW 106 may be similarly masked and implanted. Skilled practitioners will recognize that the order of implantation of the high voltage wells 104, 106 and 108 may be varied without deviating from the spirit of the presented disclosure.

In order to provide a vertically controlled profile in a doped region such as each of the wells 104, 106 and 108, multiple successive implants may be performed to create multiple implant regions. The successive implants may be used to tailor the doping profile by varying the implant energy, concentration and depth of each implant step. Additionally, the successive implant steps may implant different dopants to further customize the doping profile for a particular doped region.

The primary HVPW 104 and substrate HVPW 108 may, in one embodiment, be formed by implanting boron (B) via a first implant at a concentration between about 4.0E12 and about 5.0E12 at an energy between about 800 keV and about 900 keV to a depth of about 2 micrometers to create a first implant region, a second implant at a concentration between about 2.5E12 and about 3.5E12 at an energy between about 250 keV and about 350 keV to a depth of about 1 micrometer to form a second implant region, and a third implant at a concentration between about 2.5E12 and about 3.5E12 at an energy between about 20 keV and about 30 keV to a depth of about 0.5 micrometers or less to form a third implant region. Similarly, the isolation HVNW 106 may be formed by implanting phosphorus (P) via a first implant at a concentration between about 3.0E12 and about 5.0E12 at an energy between about 1500 keV and about 2500 keV to a depth of at least about 2 micrometers to form a first implant region, a second implant at a concentration between about 2.0E12 and about 3.0E12 at an energy between about 350 keV and about 450 keV to a depth of about 1 micrometer to form a second implant region, and implanting boron at a concentration between about 1.0E12 and about 2.0E12 at an energy between about 10 keV and about 20 keV to a depth of about 0.5 micrometers or less to form a third implant region.

Figure 4:
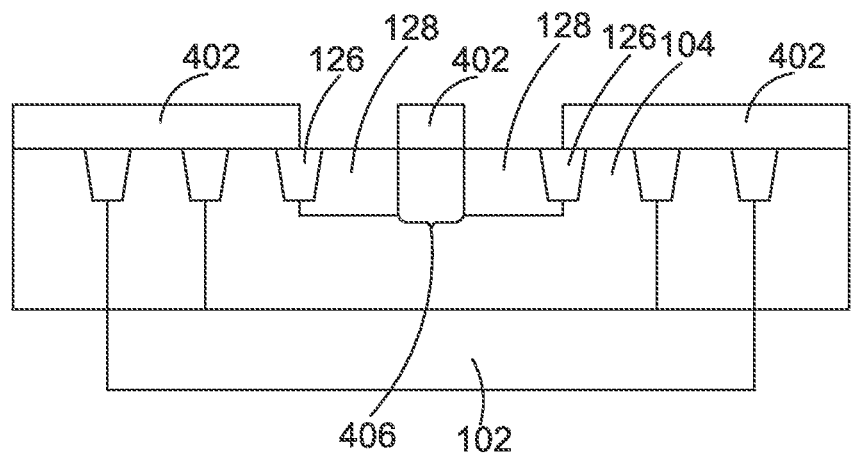

FIG. 4 illustrates formation of NDDs 128 in accordance with an embodiment. A photolithographic pattern mask 402 may be applied to define one or more NDDs 128. The NDDs 128 may be implanted through the photolithographic mask 402 openings and as two distinct NDDs 128 separated by the non-drift region 406. The NDDs 128 assist in preventing hot carriers from attaining sufficient energy to jump the gate dielectric 124 to the gate electrode 122 which may cause leakage current and damage the gate dielectric 124. The NDDs 128 may also be formed using one or more implant steps. For example, in one embodiment, the NDDs 128 may be created by implanting phosphorus (P) via a first implant at a concentration between about 4.5E12 and about 5.5E12 at an energy between about 750 keV and about 900 keV to a depth of about 0.8 micrometers to form a first implant region, a second implant at a concentration between about 3.0E12 and about 4.0E12 at an energy between about 450 keV and about 550 keV to a depth of about 0.4 micrometers to form a second implant region, and a third implant at a concentration between about 4.5E12 and about 5.5E12 at an energy between about 100 keV and about 150 keV to a depth of about 0.3 micrometers to form a third implant region.

Figure 5:
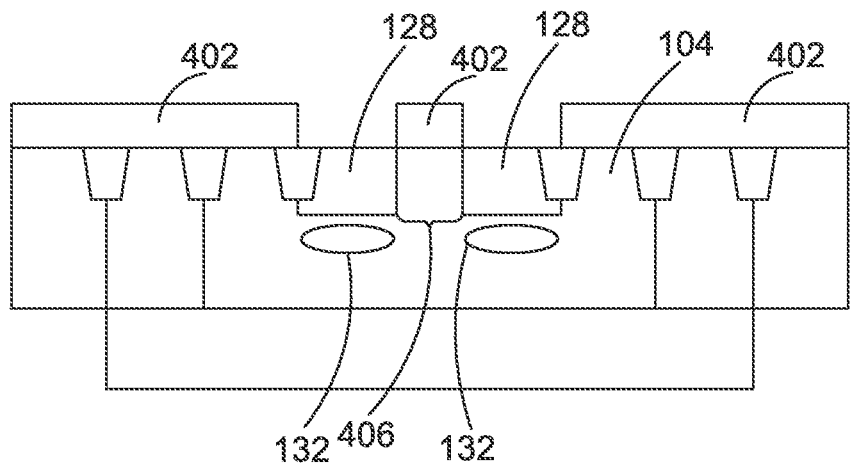

FIG. 5 illustrates forming a counter implant region 132 in accordance with an embodiment. A counter implant region 132 may be implanted under each NDD 128, in the primary HVPW 104. The counter implant region 132 may, in one embodiment, be implanted via one or more implanting steps. For example, the counter implant regions 132 may be created with boron via implantation at a concentration between about 2.0E12 and about 3.0E12 and at an energy between about 800 keV and about 900 keV to a depth of about 1.5 micrometers. In one embodiment, the counter implant regions 132 and the primary HVPW 104 will be created from a dopant of the same conductivity type, that is, an acceptor or donor type dopant. In such an embodiment, the counter implant region 132 increases the doping level of the primary HVPW 104.

The counter implant regions 132 may be created under the NDDs 128 through openings in the pattern mask 402. This results in a counter implant region 132 being created under each NDD 128 and being separated by the non-drift region 406. In one embodiment, one counter implant region 132 may be created under an NDD 128, or two or more counter implant regions 132 may be created, and each implant optionally disposed under an NDD 128. Furthermore, use of the pattern mask 402 permits use of the same mask for the NDD 128 and counter implant region 132 creation process. Masking the NDDs 128 for the counter implant region 132 implantation also permits more accurate targeting of the implantations. The counter implant region 132 may be formed directly under NDDs to target any vertical BJT 130 formation that may occur while accurate implantation reduces effects of possible doping profile changes in the remainder of the primary HVPW 104. With the multiple implant regions used to create the HVPW 104, the doping level 104 across the region between the NDD 128 and the NBL 102 may exhibit peaks and valleys reflecting the depth of the various implant region steps. The counter implant regions 132 may be implanted to raise the average doping level of the primary HVPW 104 and level out one or more irregularities in the primary HVPW 104 doping profile.

Formation of the wells 104, 106 and 108, the NDD 128 and counter implant regions 132 may optionally be followed by a well anneal performed at a temperature between about 900° C. and 1200° C. to reduce crystalline defects introduced by ion implantation.

In embodiments where multiple implants are used to create the primary HVPW 104, the counter implant regions 132 may be implanted between the different HVPW 104 implant region depths. For example, with reference to the specific embodiments of the primary HVPW 104 and counter implant region 132 implantation steps described above, after the NDD 128 formation, the primary HVPW 104 may consist of, inter alia, a first implant region of boron at about 2 micrometers and a second implant region of boron at about 1 micrometer, with a counter implant region 132 of boron at about 1.5 micrometers. This results in the counter implant region 132 between the primary HVPW 104 first and second implant regions.

Figure 6:
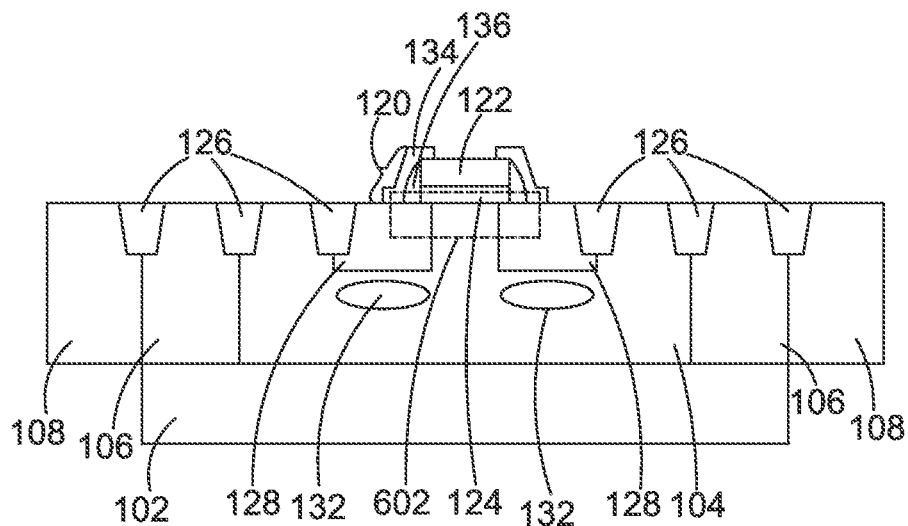

FIG. 6 illustrates formation of a gate structure 120 in accordance with an embodiment. A gate structure 120 may have a gate dielectric 124, gate electrode 122, and may be disposed over the channel region 602. In one embodiment, the gate dielectric 124 may be created as an oxide, and a polysilicon gate electrode 122 grown via epitaxy over the gate dielectric 124. In other embodiments, the gate dielectric 124 and date electrode 122 may be different materials. A gate spacer 136 and insulating layer 134 may be created as well. In an embodiment, the gate structure 120 extends over at least a portion of the NDDs 128 at each end, covering a portion of the NDDs 128. By extension, the gate structure 120 also extends over a portion of the counter implant regions 132. Skilled practitioners will recognize that other suitable techniques may be used to form the gate structure 120 without deviating from the presented disclosure.

Figure 7:
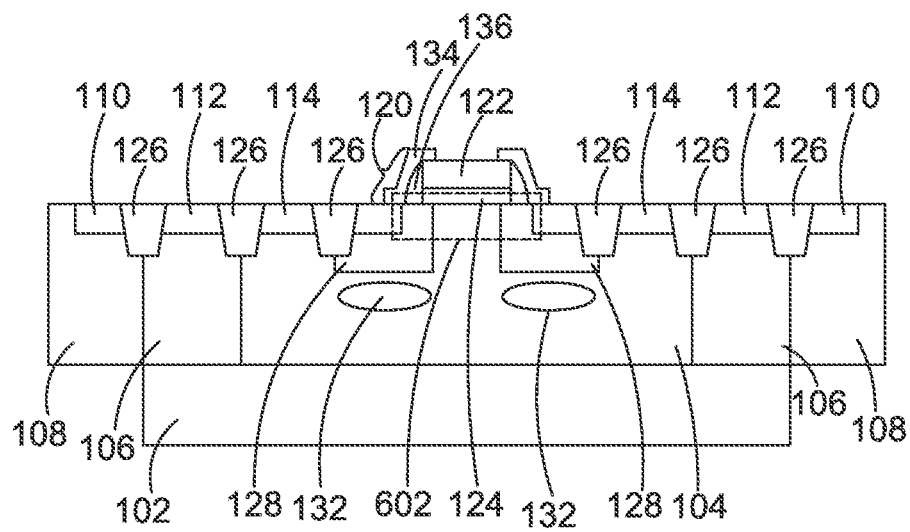

FIG. 7 illustrates a device with implanted well contacts. One embodiment may comprise masking well contact regions and then implanting the contact regions via ion implantation, or alternatively, deposition and thermal diffusion, or the like. A source 118 and drain 116 may each be implanted in the NDD 128 and be separated by a channel region 602. A p+ base structure 114 may be implanted in the primary HVPW 104. N+ isolation contacts 112 may be implanted in the isolation HVNW 106 and p+ substrate contacts 110 implanted in the substrate HVPW 108. Some embodiments of the presented disclosure may be where the contacts are disposed between STI structures 126 such that the STI structures 126 at least partially insulate the well contacts from each other.

In one embodiment, the isolation contacts 112, the source 118 and the drain 116 may be implanted in the same step, and to similar concentrations and depths. Similarly, the p+ base structures 114 and substrate contacts 110 may be deposited in the same step, separate from the n+ contact structures of the isolation contacts 112, source 118 and drain 116. In one embodiment, the contact structures may be masked using spacer techniques, where a nitride, oxide, or similar layer is grown over a mask, and then the mask removed to leave the sidewalls as spacer formations. In one possible NMOS embodiment, the n+ type contacts 112, 116 and 118 may be created via a first implant of arsenic (As) at a concentration between about 5.0E15 and about 6.0E15 at an energy between about 15 keV and about 25 keV to a depth of about 0.3 micrometers to form a first implant region, a second implant of phosphorus at a concentration between about 7.0E13 and about 8.0E13 at an energy between about 30 keV and about 40 keV to a depth of about 0.2 micrometers to form a second implant region, and a third implant of phosphorus at a concentration between about 1.0E14 and about 2.0E14 at an energy between about 10 keV and about 20 keV to a depth of about 0.2 micrometers or less to form a third implant region. In such an embodiment, the p+ type contacts 110 and 114 may be created via a first implant of fluorine (F) at a concentration between about 3.5E15 and about 4.5E15 at an energy between about 30 keV and about 40 keV to a depth of about 0.3 micrometers, and via a second implant of boron diflouride (BF2) at a concentration between about 5.0E14 and about 15.0E15 at an energy between about 50 keV and about 60 keV to a depth of about 0.2 micrometers or less.

After creation of the well contacts, standard back-end-of-line (BEOL) processing may also be performed. Thus, passivation layers, metallization layers, contact pads and the like may be added on the device as well.

Use of counter implant regions 132 may increase the ability of the device to tolerate greater drain voltages (Vdd). Furthermore, the higher drain voltages are achieved at higher gate voltages, resulting in higher drain current. For example, without a counter implant region 132, a typical power MOS may burn out at about 25 volts at a gate voltage of about 24 volts. Conversely, in a device as described herein with counter implant regions 132, a drain voltage of 37 volts can be maintained at a gate voltage of 32 volts. The lower drain voltage in the device without a counter implant region 132 may be attributed to base current contributed by the vertical BJT 130, and the counter implant region 132 raising the turn-on voltage of the vertical BJT 130, effectively reducing the vertical BJT 130 base current at a given voltage.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure that processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a device, comprising:
providing a substrate;
creating a buried layer on the substrate;
creating a primary well having a first conductivity type in the substrate over the buried layer;
creating a drift drain having a second conductivity type in the primary well; and
implanting a counter implant region having the first conductivity type in the primary well, the counter implant being interposed between the drift drain and the buried layer.

2. The method of claim 1, wherein the primary well is created via at least a first ion implantation at a first depth and a second ion implantation at a second depth less than the first depth, and wherein the counter implant region is created via a third ion implantation at a third depth less than the first depth and greater than the second depth.

3. The method of claim 2, wherein the first ion implantation is at a concentration between about 4.0E12 and about 5.0E12, and the second ion implantation is at a concentration of between about 2.5E12 and about 3.5E12.

4. The method of claim 3, wherein the third ion implantation is at a concentration between about 2.0E12 and about 3.0E12.

5. The method of claim 1, wherein the creating the drift drain comprises applying a first pattern mask over the substrate and implanting the drift drain through one or more openings in the first mask, and wherein implanting a counter implant region comprises implanting the counter implant region through the one or openings in the first mask.

6. The method of claim 5, wherein implanting a counter implant region comprises implanting at least two counter implant regions, the counter implant regions separated by a non-drift region.

7. The method of claim 6, further comprising creating a source and a drain in at least a portion of the drift drain after implanting the counter implant regions.

8. The method of claim 6, further comprising creating a gate structure on a surface of the substrate, the gate structure covering at least a portion of the drift drain.

9. A device, comprising:
a substrate;
a buried layer disposed in the substrate;
a primary well having a first conductivity type in the substrate over the buried layer;
at least one drift drain having a second conductivity type in the primary well;
at least one counter implant region in the primary well, and having the first conductivity type, the at least one counter implant region disposed between the at least one drift drain and the buried layer; and
a gate structure over the primary well and over a portion of the at least one drift drain.

10. The device of claim 9, wherein the primary well comprises a first implant region at a first depth and a second implant region at a second depth less than the first depth, and wherein first the counter implant region is disposed between the first implant region and the second implant region.

11. The device of claim 9, wherein the primary well first and counter implant region each comprise dopants of a same conductivity type.

12. The device of claim 11, wherein the primary well is a high voltage p well comprising a p-type dopant and the first counter implant region comprises a p-type dopant.

13. The device of claim 9, comprising:
two or more drift drains;
two or more counter implant region, each counter implant region disposed between a drift drain and a portion of the buried layer; and
a source and drain each disposed in one the drift drains.

14. The device of claim 13, further comprising:
a p+-type base structure disposed in the primary well and at a surface of the primary well, the base structure encircling the source and drain at the surface of the primary well; and
an STI structure disposed in the primary well and between the base structure and the source and drain.

15. A device, comprising:
a primary well having a first implant region at a first depth from a first side of the primary well and a second implant region at a second depth from the first side, wherein the second depth less than the first depth;
a buried layer disposed at a second side of the primary well;
a plurality of drift drains disposed in the primary well and having a first conductivity type; and
a plurality of counter implant regions in the primary well and having a second conductivity type, each counter implant region disposed between the buried layer and one of the drift drains.

16. The device of claim 15, wherein the first depth is about 2 micrometers and the second depth is about 1 micrometer.

17. The device of claim 16, wherein the counter implants are disposed at a depth of about 1.5 micrometers.

18. The device of claim 15, wherein the primary well and counter implant region comprise dopants of a same conductivity type.

19. The device of claim 15, wherein the buried layer has the first conductivity type.

20. The device of claim 15, wherein the primary well is surrounded by an isolation well having the first conductivity type.

* * * * *